(12) United States Patent
Maeda et al.

(10) Patent No.: US 8,582,615 B2
(45) Date of Patent: Nov. 12, 2013

(54) SEMICONDUCTOR LIGHT-EMITTING DEVICE

(75) Inventors: Osamu Maeda, Miyagi (JP); Masaki Shiozaki, Kanagawa (JP); Susumu Sato, Kanagawa (JP); Takahiro Arakida, Kanagawa (JP); Shiro Uchida, Tokyo (JP)

(73) Assignee: Sony Corporation, Tokyo (JP)

( * ) Notice: Subject to any disclaimer, the term of this patent is extended or adjusted under 35 U.S.C. 154(b) by 206 days.

(21) Appl. No.: 13/064,424

(22) Filed: Mar. 24, 2011

(65) Prior Publication Data

US 2011/0243174 A1 Oct. 6, 2011

(30) Foreign Application Priority Data

Apr. 2, 2010 (JP) ................. P2010-086313

(51) Int. Cl.
*H01S 5/026* (2006.01)
*H01S 5/187* (2006.01)

(52) U.S. Cl.
USPC ............. 372/34; 372/50.12; 372/50.124

(58) Field of Classification Search
USPC ................. 372/34, 50.12, 50.124
See application file for complete search history.

(56) References Cited

U.S. PATENT DOCUMENTS

| 7,428,995 B1* | 9/2008 | Stern et al. ............... 235/462.01 |
| 2003/0210873 A1* | 11/2003 | Moretti ........................... 385/89 |
| 2004/0076205 A1* | 4/2004 | Tatum et al. .................... 372/43 |
| 2010/0027578 A1* | 2/2010 | Takeuchi ................. 372/50.124 |

FOREIGN PATENT DOCUMENTS

JP 2008-306118 A 12/2008

* cited by examiner

*Primary Examiner* — Jessica Stultz
*Assistant Examiner* — Michael Carter
(74) *Attorney, Agent, or Firm* — Rader, Fishman & Grauer PLLC

(57) ABSTRACT

There is provided a semiconductor light-emitting device including a temperature detecting section which is allowed to accurately estimate an element temperature. The semiconductor light-emitting device includes: one or a plurality of surface-emitting semiconductor light-emitting sections and one or a plurality of semiconductor temperature detecting sections on a semiconductor substrate, the surface-emitting semiconductor light-emitting sections emitting light in a direction normal to the semiconductor substrate, the semiconductor temperature detecting sections not emitting light to outside. The semiconductor light-emitting sections and the semiconductor temperature detecting sections have a PN junction or a PIN junction in a direction normal to the semiconductor substrate.

8 Claims, 5 Drawing Sheets

SEMICONDUCTOR LIGHT-EMITTING DEVICE

BACKGROUND OF THE INVENTION

1. Field of the Invention

The present invention relates to a semiconductor light-emitting device including a surface-emitting semiconductor light-emitting section which has a light emission region on a top surface thereof.

2. Description of the Related Art

Unlike a Fabry-Perot laser diode, a vertical-cavity surface-emitting laser (VCSEL) emits light in a direction orthogonal to a substrate, and in the vertical-cavity surface-emitting laser, a large number of resonator configurations are allowed to be arranged in a two-dimensional array on a single substrate. Therefore, in recent years, the vertical-cavity surface-emitting laser has received attention in technical fields of data communications, printers and the like.

The vertical-cavity surface-emitting laser typically has a mesa resonator configuration configured by laminating a lower DBR layer, a lower spacer layer, an active layer, an upper spacer layer, a current confinement layer, an upper DBR layer and a contact layer in this order on a substrate. In such a laser diode, the oscillation wavelength thereof is determined by an effective resonator length of a resonator configuration, and the magnitude of a light output is maximized at a light emission wavelength corresponding to a band gap of the active layer. Therefore, as described in Japanese Unexamined Patent Application Publication No. 2008-306118, typically, a resonator configuration and an active layer are configured so that the effective resonator length of the resonator configuration and the light emission wavelength of the active layer are equal to each other.

SUMMARY OF THE INVENTION

In a typical vertical-cavity surface-emitting laser, its resonator configuration is extremely small. Therefore, an increase in the temperature of an active layer by current injection is large, and a phenomenon called "droop" in which a light output is reduced with an increase in the temperature of the active layer may be caused. Moreover, in some cases, a threshold current is changed by positively changing an element temperature to change a difference (wavelength detuning $\Delta\lambda$) between the effective resonator length of the resonator configuration and the light emission wavelength of the active layer. However, in this case, the waveform of the light output is distorted, compared to a current pulse waveform.

To solve such issues, it is necessary to accurately measure a substrate temperature or an ambient temperature and accurately estimate an element temperature (specifically, the temperature of the active layer), and a thermistor is typically used to measure the substrate temperature or the ambient temperature. However, the element size of the thermistor is large, and it is extremely difficult to mount the thermistor on a surface of a laser element. Therefore, the thermistor is typically arranged on a submount (not illustrated) where a laser element is mounted; therefore, it is difficult to accurately estimate the element temperature.

It is desirable to provide a semiconductor light-emitting device allowed to accurately estimate an element temperature.

According to an embodiment of the invention, there is provided a semiconductor light-emitting device including: one or a plurality of surface-emitting semiconductor light-emitting sections and one or a plurality of semiconductor temperature detecting sections on a semiconductor substrate, the surface-emitting semiconductor light-emitting sections emitting light in a direction normal to the semiconductor substrate, the semiconductor temperature detecting sections not emitting light to outside. The semiconductor light-emitting sections and the semiconductor temperature detecting sections have a PN junction or a PIN junction in a direction normal to the semiconductor substrate.

In the semiconductor light-emitting device according to the embodiment of the invention, the semiconductor temperature detecting section is arranged on the semiconductor substrate with the semiconductor light-emitting section. Therefore, the semiconductor temperature detecting section is allowed to detect a substrate temperature of an element or an ambient temperature in close proximity to the semiconductor light-emitting section.

In the semiconductor light-emitting device according to the embodiment of the invention, the substrate temperature of the element or the ambient temperature is allowed to be detected in close proximity to the semiconductor light-emitting section; therefore, an element temperature is allowed to be estimated accurately.

Other and further objects, features and advantages of the invention will appear more fully from the following description.

DETAILED DESCRIPTION OF THE PREFERRED EMBODIMENTS

Figure 1A:
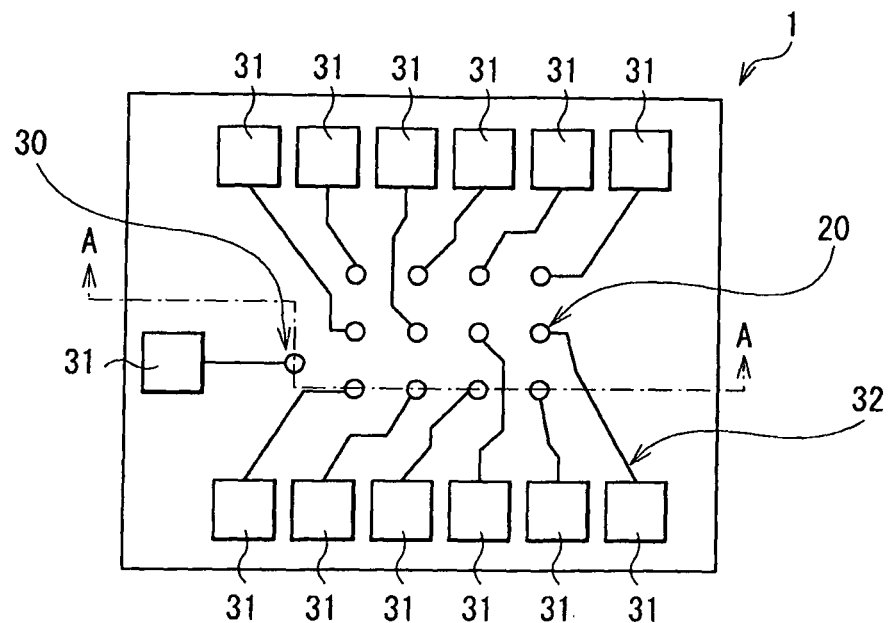
FIGS. 1A and 1B are a top view and a sectional view illustrating an example of a configuration of a laser diode array according to an embodiment of the invention.
Figure 1B:
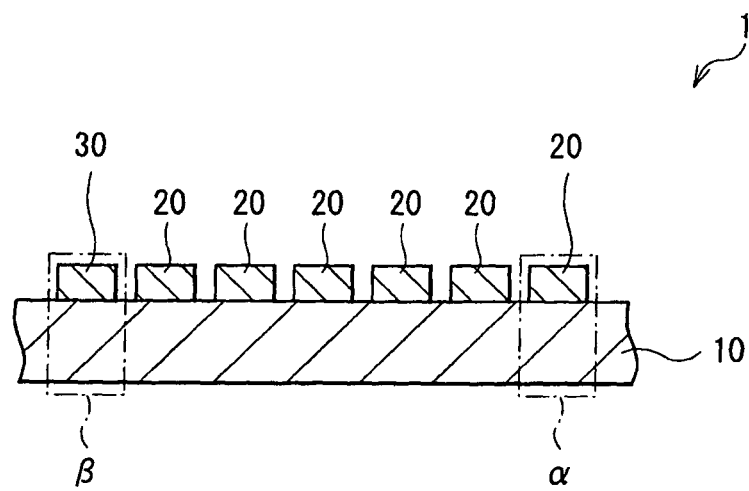

A preferred embodiment of the invention will be described in detail below referring to the accompanying drawings. Descriptions will be given in the following order.
1. Embodiment
Configuration
Operation
Effects
2. Modifications
Configuration FIG. 1A illustrates an example of a top-side configuration of a laser diode array 1 according to an embodiment of the invention. FIG. 1B illustrates an example of a sectional configuration taken along an arrow direction A-A of the laser diode array 1 in FIG. 1A. As illustrated in FIGS. 1A and 1B, the laser diode array 1 includes a plurality of laser configuration sections 20 and one temperature detecting section 30 on a top surface of a semiconductor substrate 10. Each of the laser configuration sections 20 is a vertical-cavity surface-emitting laser emitting light in a direction normal to the semiconductor substrate 10. On the other hand, the temperature detecting section 30 is a vertical-cavity surface-emitting laser not emitting light to outside. The laser configuration sections 20 and the temperature detecting section 30 each are electrically connected to a pad electrode 31 through an extraction wiring line 32. Note that the laser diode array 1 corresponds to a specific example of "semiconductor light-emitting device" in the invention. Moreover, the laser configuration section 20 and the temperature detecting section 30 correspond to specific examples of "semiconductor light-emitting section" and "semiconductor temperature detecting section" in the invention, respectively.

Figure 2:
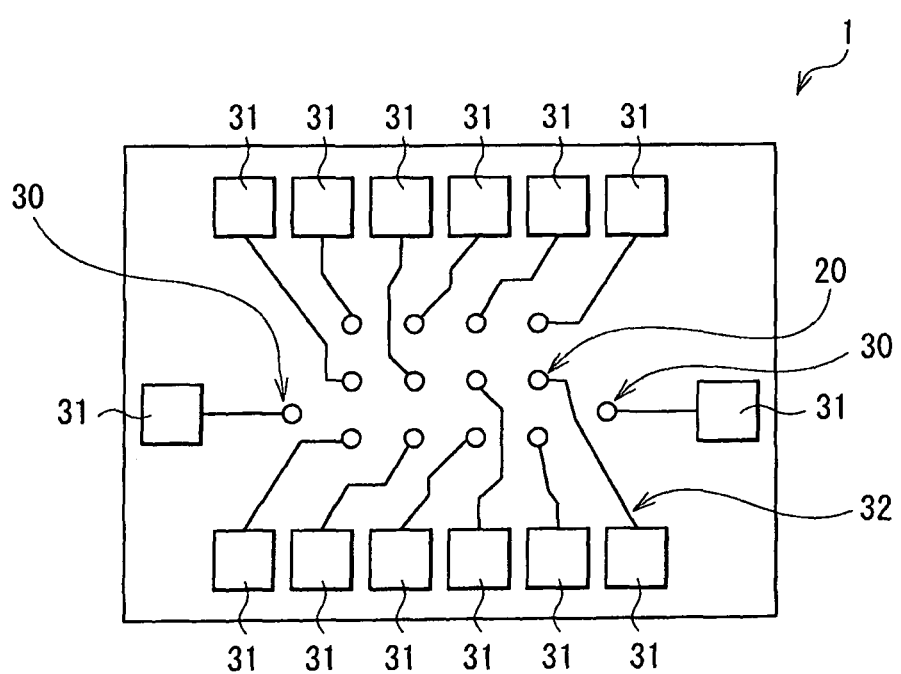
FIG. 2 is a top view illustrating another example of the configuration of the laser diode array in FIGS. 1A and 1B.

In FIG. 1A, the case where 12 laser configuration sections 20 are two-dimensionally arranged on a top surface of the semiconductor substrate 10 is illustrated; however, the number of laser configuration sections 20 is not specifically limited. Moreover, in FIG. 1A, the case where one temperature detecting section 30 is arranged on the top surface of the semiconductor substrate 10 is illustrated; however, a plurality of temperature detecting sections 30 may be arranged on the top surface of the semiconductor substrate 10. For example, as illustrated in FIG. 2, two temperature detecting sections 30 may be arranged on the top surface of the semiconductor substrate 10. At this time, for example, two temperature detecting sections 30 may be symmetrically arranged with respect to the plurality of laser configuration sections 20.

Figure 3:
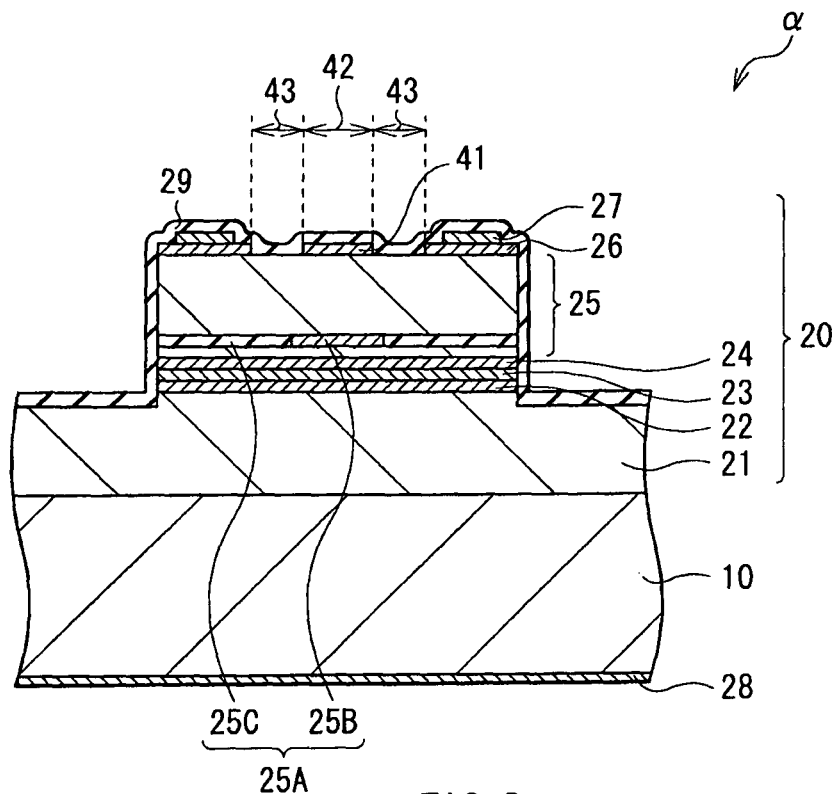
FIG. 3 is a sectional view illustrating an example of a configuration of a laser configuration section in FIGS. 1A and 1B.
Figure 4:
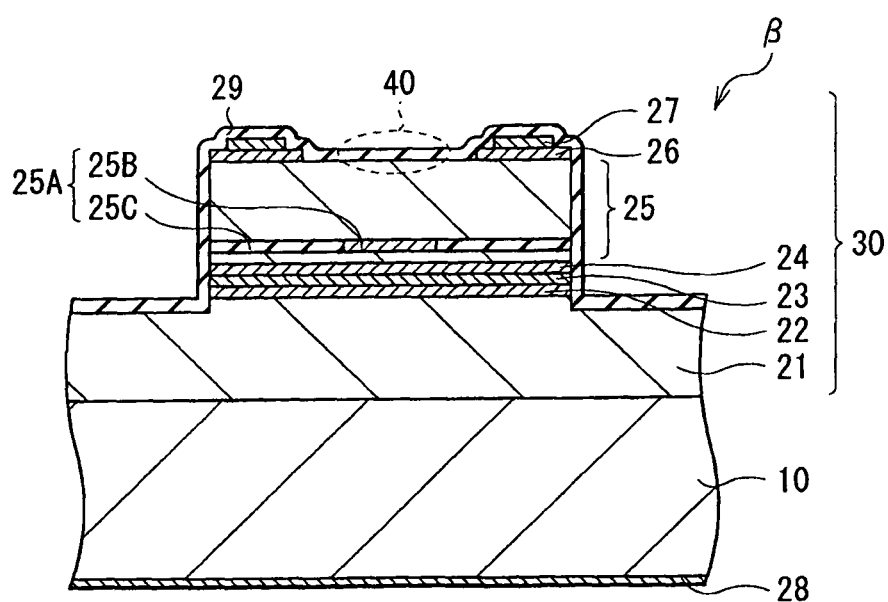
FIG. 4 is a sectional view illustrating an example of a configuration of a temperature detecting section in FIGS. 1A and 1B.

FIG. 3 is an enlarged view of an example of a sectional configuration of a portion a (refer to FIG. 1B) including one laser configuration section 20 in the laser diode array 1. FIG. 4 is an enlarged view of an example of a sectional configuration of a portion β (refer to FIG. 1B) including one temperature detecting section 30 in the laser diode array 1. In the embodiment, the laser configuration section 20 and the temperature detecting section 30 are formed on the semiconductor substrate 10 as a growth substrate, and, for example, as illustrated in FIGS. 3 and 4, the laser configuration section 20 and the temperature detecting section 30 have the same laminate configuration.

More specifically, for example, as illustrated in FIGS. 3 and 4, the laser configuration section 20 and the temperature detecting section 30 each are configured by laminating a lower DBR layer 21, a lower spacer layer 22, an active layer 23, an upper spacer layer 24, an upper DBR layer 25 and a contact layer 26 in order on the semiconductor substrate 10. In other words, laminate portions (PIN junction portions) from the lower DBR layer 21 to the contact layer 26 of the laser configuration section 20 and the temperature detecting section 30 have the same laminate configuration. Note that the lower DBR layer 21 corresponds to a specific example of "first multilayer reflective mirror" in the invention, and the upper DBR layer 25 corresponds to a specific example of "second multilayer reflective mirror" in the invention.

Moreover, for example, the laser configuration section 20 and the temperature detecting section 30 each include a current confinement layer 25A in a part of the upper DBR layer 25. Further, an upper portion of the lower DBR layer 21, the lower spacer layer 22, the active layer 23, the upper spacer layer 24, the upper DBR layer 25 and the contact layer 26 form a columnar shape. For example, as illustrated in FIGS. 3 and 4, the contact layer 26 is formed only on an edge portion of a top surface of the upper DBR layer 25. Note that the contact layer 26 may be formed on the whole top surface of the upper DBR layer 25.

The semiconductor substrate 10 is configured of, for example, an n-type GaAs substrate. Although not illustrated, the lower DBR layer 21 is configured by alternately laminating a low-refractive index layer and a high-refractive index layer. In this case, the low-refractive index layer is made of n-type $Al_{x1}Ga_{1-x1}As$ with an optical thickness of $\lambda/4$ ($\lambda$ is an oscillation wavelength), and the high-refractive index layer is made of n-type $Al_{x2}Ga_{1-x2}As$ (x1>x2) with an optical thickness of $\lambda/4$. Note that examples of an n-type impurity include silicon (Si) and selenium (Se).

The lower spacer layer 22 is made of, for example, undoped AlGaAs. The active layer 23 is made of, for example, an undoped GaAs-based material. In the active layer 23, a region facing a current injection region 25B which will be described later is a light emission region. The upper spacer layer 24 is made of, for example, undoped AlGaAs.

Although not illustrated, the upper DBR layer 25 is configured by alternately laminating a low-refractive index layer and a high-refractive index layer. In this case, the low-refractive index layer is made of, for example, p-type $Al_{x3}Ga_{1-x3}As$ with an optical thickness of $\lambda/4$, and the high-refractive index layer is made of, for example, p-type $Al_{x4}Ga_{1-x4}As$ (x3>x4) with an optical thickness of $\lambda/4$. The contact layer 26 is made of, for example, p-type GaAs. Note that examples of a p-type impurity include zinc (Zn), magnesium (Mg) and beryllium (Be).

The current confinement layer 25A includes a current confinement region 25C in an edge region thereof, and the current injection region 25B in a central region thereof. The current injection region 25B is made of, for example, p-type AlGaAs or p-type AlAs. The current confinement region 25C includes $Al_2O_3$ (aluminum oxide), and is obtained by oxidizing high levels of Al included in AlGaAs or AlAs from a side surface thereof in a manufacturing process. Therefore, the current confinement layer 25A has a function of confining a current.

Moreover, in the laser configuration section 20 and the temperature detecting section 30, a ring-shaped upper electrode 27 having an aperture in a region corresponding to the above-described current injection region 25B is formed on a top surface of the contact layer 26. The upper electrode 27 is connected to an extraction wiring line 32. Moreover, a lower electrode 28 is formed on a back surface of the semiconductor substrate 10. The lower electrode 28 functions as a common electrode for the laser configuration sections 20 and the temperature detecting section 30. Further, an insulating layer 29 is formed on surfaces (side surfaces and top surfaces) of each of the laser configuration sections 20 and the temperature detecting section 30. The insulating layer 29 is formed so that side surfaces and top surfaces of columnar portions of the laser configuration section 20 and the temperature detecting section 30 are covered with the insulating layer 29.

In this case, the upper electrode 27 and the electrode pad 31 are configured by laminating, for example, titanium (Ti), platinum (Pt) and gold (Au) in this order, and are electrically connected to the contact layer 26. The extraction wiring line 32 is formed by, for example, soldering. The lower electrode 28 has, for example, a configuration in which an alloy of gold (Au) and germanium (Ge), nickel (Ni) and gold (Au) are laminated in order on the semiconductor substrate 10, and is electrically connected to the semiconductor substrate 10.

Moreover, a phase adjustment layer 41 is formed on a top surface of the laser configuration section 20, more specifically, between a top surface of a semiconductor portion of the laser configuration section 20 and the insulating layer 29. The phase adjustment layer 41 is formed in a central region (that is, a region where fundamental transverse mode oscillation mainly occurs) of a region where laser light is emitted. In this case, a laminate portion configured of a portion facing the phase adjustment layer 41 of the insulating layer 29 and the phase adjustment layer 41 forms a high-reflectivity region 42, and a portion which is a portion not facing the phase adjustment layer 41 of the insulating layer 29 as well as an edge portion (that is, a region where high-order transverse mode oscillation mainly occurs) of the region where laser light is emitted forms a low-reflectivity region 43.

The phase adjustment layer 41 has a film thickness of $(2a-1)\lambda/4n_1$ (a is an integer of 1 or more, and $n_1$ is an refractive index), and is made of a material with the refractive index $n_1$ lower than the refractive index of a top surface of the semiconductor portion of the laser configuration section 20, for example, a dielectric such as $SiO_2$ (silicon oxide). The portion facing the phase adjustment layer 41 of the insulating layer 29 has a film thickness of $(2b-1)\lambda/4n_2$ (b is an integer of 1 or more, and $n_2$ is an refractive index), and is made of a material with the refractive index $n_2$ higher than the refractive index $n_1$ of the phase adjustment layer 41, for example, a dielectric such as SiN (silicon nitride). The portion which is the portion not facing the phase adjustment layer 41 of the insulating layer 29 as well as the edge portion of the region where laser light is emitted has a film thickness of $(2c-1)\lambda/4n_3$ (c is an integer of 1 or more, and $n_3$ is an refractive index), and is made of a material with the refractive index $n_3$ lower than the refractive index $n_1$ of the phase adjustment layer 41, for example, a dielectric such as SiN (silicon nitride).

In this case, these refractive indexes are preferably adjusted so as to satisfy a relationship represented by the following expression, where the reflectivity of the high-reflectivity region 42 is $R_1$, the reflectivity of the low-refractivity region 43 is $R_2$ and the reflectivity in the case where the insulating layer 29 and the phase adjustment layer 41 are not arranged in the region where laser light is emitted is $R_3$. Therefore, only high-order transverse mode oscillation is allowed to be suppressed without reducing a fundamental transverse mode light output.

$$R_1 \geq R_3 > R_2$$

Note that the phase adjustment layer 41 may be removed as necessary. However, in such a case, the insulating layer 29 preferably has a thickness which is not allowed to reduce reflectivity in the region where laser light is emitted.

On the other hand, in the temperature detecting section 30, a portion where laser light is emitted of the insulating layer 29 functions as a low-reflectivity layer 40. The low-reflectivity layer 40 is set to have a thickness and a refractive index which are allowed to cause laser oscillation only in the laser configuration section 20 and not cause laser oscillation in the temperature detecting section 30 when the same current flows through the laser configuration section 20 and the temperature detecting section 30. More specifically, the low-reflectivity layer 40 has a film thickness of $(2d-1)\lambda/4n_4$ (d is an integer of 1 or more, and $n_4$ is a refractive index), and is made of a material with the refractive index $n_4$ higher than the refractive index of a top surface of the semiconductor portion of the temperature detecting section 30, for example, a dielectric such as SiN (silicon nitride).

A vertical-cavity surface-emitting laser typically performs laser oscillation at a current of approximately 3 mA, and the above-described laser configuration section 20 also performs laser oscillation at a current of approximately 3 mA irrespective of the presence or absence of the phase adjustment layer 41. On the other hand, although the semiconductor portion of the temperature detecting section 30 has the same configuration as the semiconductor portion of the laser configuration section 20, the low-reflectivity layer 40 on the top surface of the temperature detecting section 30 does not allow the temperature detecting section 30 to perform laser oscillation at a current of approximately 3 mA. Therefore, even though a current of approximately 3 mA flows through the temperature detecting section 30, the temperature detecting section 30 is kept in a non-oscillation state; therefore, the resistance of the temperature detecting section 30 is stabilized at a higher value than that during oscillation. Therefore, when the temperature of the semiconductor substrate 10 or an ambient temperature around the laser diode array 1 is changed to change the voltage of the temperature detecting section 30 accordingly, such a voltage change is stabilized.

Figure 5:
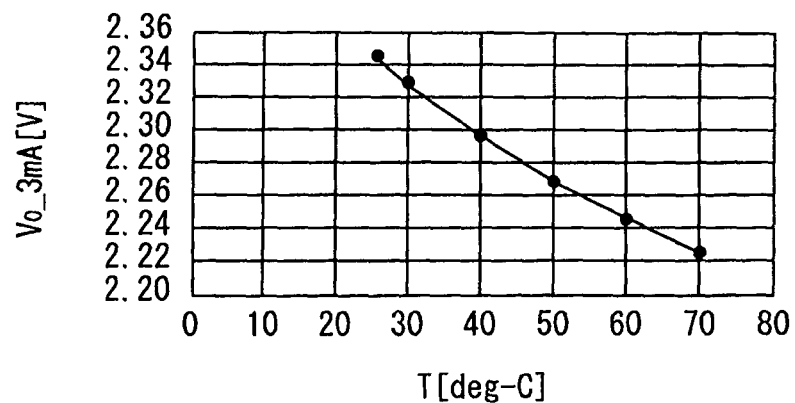
FIG. 5 is an illustration of an example of a relationship between temperature and an output voltage in the temperature detecting section in FIGS. 1A and 1B.

In the case where a constant current of approximately 3 mA flows through the temperature detecting section 30, when the temperature of the semiconductor substrate 10 or the ambient temperature around the laser diode array 1 changes, for example, a voltage change as illustrated in FIG. 5 occurs in the temperature detecting section 30. A gradient of the voltage change is substantially constant without varying from one temperature detecting section 30 to another. However, a voltage value may vary from one temperature detecting section 30 to another. In such a case, a voltage value obtained from the temperature detecting section 30 is preferably corrected so as to be a predetermined value when the temperature of the semiconductor substrate 10 or the ambient temperature around the laser diode array 1 is at a certain value.

Figure 6:
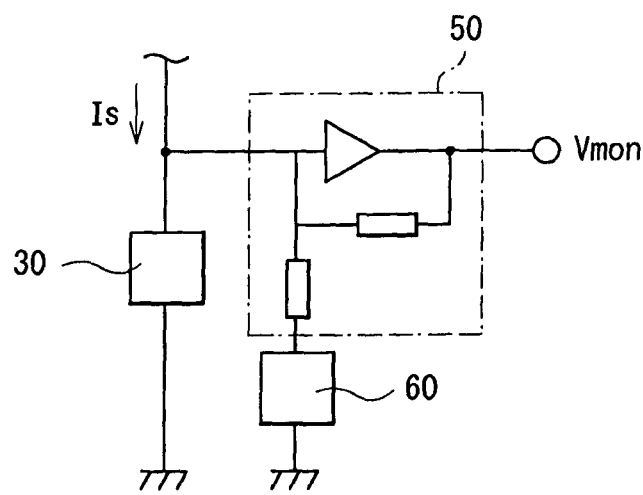
FIG. 6 is an illustration of an example of a configuration for adjusting an offset of a detection voltage taken out of the temperature detecting section in FIGS. 1A and 1B.

For example, as illustrated in FIG. 6, an amplifying section 50 amplifying the voltage of the temperature detecting section 30 and an offset adjusting section 60 adjusting an offset of a detection voltage ($V_{mon}$) transmitted from the amplifying section 50 are preferably attached to the laser diode array 1. The offset adjusting section 60 includes, for example, variable resistance. In such a case, while a constant current Is flows through the temperature detecting section 30, the temperature of the semiconductor substrate 10 or the ambient temperature around the laser diode array 1 reaches a certain value, and at this time, when the value of the voltage ($V_{mon}$) transmitted from the amplifying section 50 is largely deviated from the predetermined value, the value of the voltage ($V_{mon}$) transmitted from the amplifying section 50 is allowed to be corrected to the predetermined value, for example, by adjusting the value of the variable resistance in the offset adjusting section 60.

Operation

Next, an example of an operation of the laser diode array 1 according to the embodiment will be described below. In the laser diode array 1 according to the embodiment, a pulse current is applied to each of the laser configuration sections 20 independently so as to output pulsed laser light from each of the laser configuration sections 20. At this time, a constant current Is flows through the temperature detecting section 30, and the voltage value of the temperature detecting section 30 is constantly monitored, and the waveform of the pulse current applied to each of the laser configuration sections 20 is corrected with use of the monitored voltage value so that an light output has a rectangular waveform.

The waveform of the light output is often distorted, for example, when an element temperature is increased or when wavelength detuning $\Delta\lambda$ is set to a large value. In the embodiment, even though the waveform of the light output may be distorted by the above-described factors, the distorted waveform of the light output is corrected with use of the voltage value obtained from the temperature detecting section 30.

Effects

In the embodiment, the temperature detecting section 30 is arranged on the semiconductor substrate 10 with the laser configuration sections 20. Therefore, the temperature detecting section 30 is allowed to detect the temperature of the semiconductor substrate 10 or the ambient temperature around the semiconductor layer array 1 in close proximity to each of the laser configuration sections 20. As a result, the element temperature is allowed to be estimated accurately. Therefore, in the embodiment, the waveform of the pulse current applied to each of the laser configuration sections 20 is allowed to be corrected accurately so as to have a rectangular shape.

Moreover, in the embodiment, a thermistor is not necessary, and the temperature detecting section 30 is allowed to be formed with the laser configuration sections 20 in a process of manufacturing the laser configuration sections 20; therefore, compared to the case where the thermistor is used as in the case of related art, component cost is allowed to be reduced.

Further, in the embodiment, in the case where a plurality of temperature detecting sections 30 are arranged, for example, an average value of voltage values obtained from the temperature detecting sections 30 may be used for correction of the waveform of the pulse current. In such a case, correction with higher stability and less error is allowed.

Modifications

Figure 7:
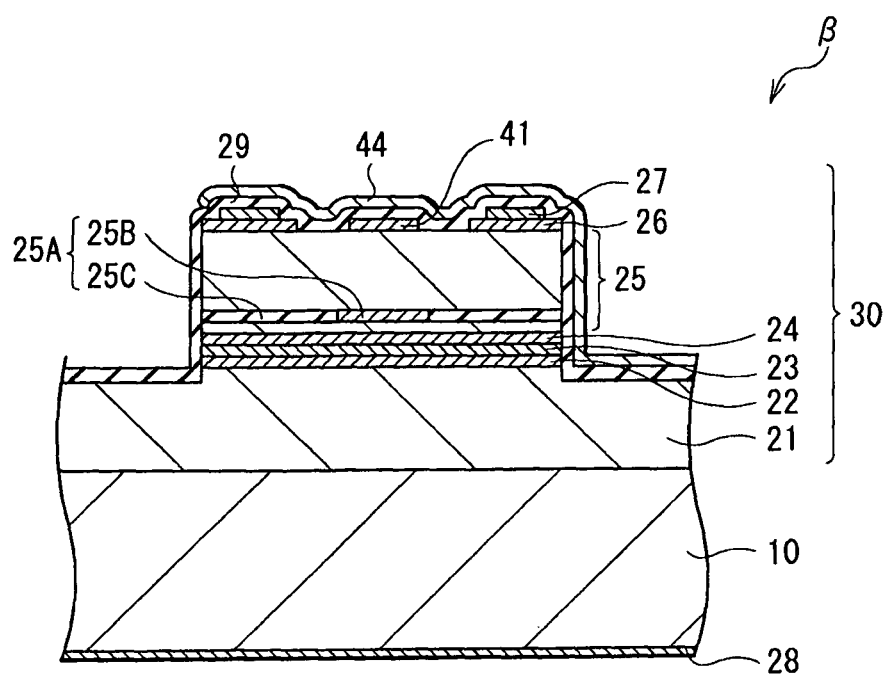
FIG. 7 is an illustration of another example of the configuration of the temperature detecting section in FIG. 4.

In the above-described embodiment, the phase adjustment layer 41 is arranged only in the laser configuration section 20; however, the phase adjustment layer 41 may be also arranged in the temperature detecting section 30. In such a case, laser oscillation occurs in the temperature detecting section 30 to emit laser light to outside; therefore, for example, as illustrated in FIG. 7, a metal layer 44 may be arranged on the whole top surface of the temperature detecting section 30 to prevent laser light from being leaked to outside. Moreover, although not illustrated, the metal layer 44 may be arranged on the whole top surface of the temperature detecting section 30 illustrated in FIG. 3. In such a case, even small light with an LED light emission level is blocked by the metal layer 44. Therefore, the metal layer 44 is preferably arranged in the case where a light output with low noise is necessary.

Moreover, in the above-described embodiment, the temperature detecting section 30 is formed on the semiconductor substrate 10 as a growth substrate; however, the temperature detecting section 30 may be formed on a substrate different from the semiconductor substrate 10 as a growth substrate. However, in such a case, the laser diode array 1 is allowed to be formed by mounting the temperature detecting section 30 on the semiconductor substrate 10.

Further, in the above-described embodiment and the modifications thereof, the laser configuration sections 20 are formed on the semiconductor substrate 10 as a growth substrate; however, the laser configuration sections 20 may be formed on a substrate different from the semiconductor substrate 10 as a growth substrate. However, in such a case, the laser diode array 1 is allowed to be formed by mounting the laser configuration sections 20 on the semiconductor substrate 10.

Moreover, in the above-described embodiment and the modifications thereof, the case where a plurality of laser configuration sections 20 are arranged is described; however, the number of laser configuration sections 20 is not necessarily plural, and may be only one.

Further, in the above-described embodiment and the modifications thereof, the case where the invention is applied to the laser diode array is described; however, the invention is applicable to, for example, an LED array. In this case, the semiconductor light-emitting section and the semiconductor temperature detecting section have the same LED configuration, and have the same PN junction configuration or the same PIN junction configuration.

The present application contains subject matter related to that disclosed in Japanese Priority Patent Application JP 2010-086313 filed in the Japan Patent Office on Apr. 2, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light-emitting device comprising:
one or more of surface-emitting semiconductor light-emitting sections and one or more semiconductor temperature detecting sections on a semiconductor substrate, the surface-emitting semiconductor light-emitting sections emitting light in a direction normal to the semiconductor substrate, the semiconductor temperature detecting sections not emitting light,
wherein the semiconductor light-emitting sections and the semiconductor temperature detecting sections have a PN junction or a PIN junction in a direction normal to the semiconductor substrate, the semiconductor light-emitting device further comprising:
a circuit for adjusting an offset of a detection voltage transmitted from each of the semiconductor temperature detecting sections.

2. The semiconductor light-emitting device according to claim 1, wherein
the semiconductor light-emitting sections and the semiconductor temperature detecting sections have the same configuration of the PN junction or the PIN junction.

3. The semiconductor light-emitting device according to claim 2, wherein
both of the semiconductor light-emitting sections and the semiconductor temperature detecting sections have a laminate configuration including a first multilayer reflective mirror, an active layer and a second multilayer reflective minor in this order.

4. The semiconductor light-emitting device according to claim 1, wherein
the semiconductor light-emitting sections and the semiconductor temperature detecting sections have the same laminate configuration.

5. The semiconductor light-emitting device according to claim 1, wherein
both of the semiconductor light-emitting sections and the semiconductor temperature detecting sections are formed on the semiconductor substrate as a growth substrate.

6. The semiconductor light-emitting device according to claim 1, wherein
the semiconductor temperature detecting sections each have a low-reflectivity layer on a top surface thereof.

7. The semiconductor light-emitting device according to claim 1, wherein
the semiconductor temperature detecting sections each include a metal layer on a whole top surface thereof.

8. A semiconductor light-emitting device comprising:
a plurality of surface-emitting semiconductor light-emitting sections and a plurality of semiconductor temperature detecting sections on a semiconductor substrate, the semiconductor light-emitting sections emitting light in a direction normal to the semiconductor substrate, the semiconductor temperature detecting sections not emitting light to outside, and a circuit for adjusting an offset of a detection voltage transmitted from each of the semiconductor temperature detecting sections,
wherein the semiconductor light-emitting sections and the semiconductor temperature detecting sections have a PN junction or a PIN junction in a direction normal to the semiconductor substrate.

* * * * *